United States Patent
Shin et al.

(10) Patent No.: US 10,790,460 B2
(45) Date of Patent: *Sep. 29, 2020

(54) ORGANIC LIGHT-EMITTING DISPLAY DEVICE

(71) Applicant: LG Display Co., Ltd., Seoul (KR)

(72) Inventors: JooHwan Shin, Goyang-si (KR); BongChul Kim, Daegu (KR); Jaewook Park, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/688,778

(22) Filed: Nov. 19, 2019

(65) Prior Publication Data

US 2020/0111979 A1  Apr. 9, 2020

Related U.S. Application Data

(63) Continuation of application No. 16/281,787, filed on Feb. 21, 2019, now Pat. No. 10,505,131, which is a (Continued)

(30) Foreign Application Priority Data

Aug. 31, 2015 (KR) .......... 10-2015-0123243
Dec. 23, 2015 (KR) .......... 10-2015-0184885

(51) Int. Cl.
*H01L 51/00* (2006.01)
*H01L 51/52* (2006.01)

(52) U.S. Cl.
CPC ...... *H01L 51/0097* (2013.01); *H01L 51/5246* (2013.01); *H01L 51/5253* (2013.01);
(Continued)

(58) Field of Classification Search
CPC .................................................. H01L 51/0097
See application file for complete search history.

(56) References Cited

U.S. PATENT DOCUMENTS 6,906,425 B2    6/2005  Stewart et al.
9,960,375 B2*   5/2018  Shin .............. H01L 51/0097
(Continued)

FOREIGN PATENT DOCUMENTS

CN   102902109 A        1/2013
KR   10-2015-0045329 A  4/2015
WO   WO 2014/136259 A1  9/2014

OTHER PUBLICATIONS

European Patent Office, Communication Pursuant to Article 94(3) EPC, EP Patent Application No. 16186330.3, dated Nov. 9, 2018, six pages.
(Continued)

*Primary Examiner* — William Coleman
(74) *Attorney, Agent, or Firm* — Fenwick & West LLP (57) ABSTRACT

Disclosed herein is an organic light-emitting display device having a first flexible substrate; a second flexible substrate; a plurality of organic light-emitting pixels on the first flexible substrate and between the first flexible substrate and the second flexible substrate; an encapsulation unit covering the pixels; and an adhesive layer on the encapsulation unit. The Young's modulus of the adhesive layer is equal to or larger than a value so that the first flexible substrate is not deformed by bending stress when it is rolled up.

20 Claims, 4 Drawing Sheets

Related U.S. Application Data continuation of application No. 15/927,692, filed on Mar. 21, 2018, now Pat. No. 10,263,204, which is a continuation of application No. 15/248,852, filed on Aug. 26, 2016, now Pat. No. 9,960,375.

(52) U.S. Cl.
CPC .. *H01L 51/5259* (2013.01); *H01L 2251/5338* (2013.01); *H01L 2251/558* (2013.01); *Y02E 10/549* (2013.01); *Y02P 70/521* (2015.11)

(56) References Cited

U.S. PATENT DOCUMENTS

| | | | |
|---|---|---|---|
| 10,263,204 B2* | 4/2019 | Shin | H01L 51/0097 |
| 10,505,131 B2* | 12/2019 | Shin | H01L 51/0097 |
| 2003/0170444 A1 | 9/2003 | Stewart et al. | |
| 2015/0048349 A1 | 2/2015 | Kawata et al. | |
| 2015/0108435 A1 | 4/2015 | Huh et al. | |
| 2016/0028032 A1 | 1/2016 | Okada | |

OTHER PUBLICATIONS

European Patent Office, Communication Pursuant to Article 94(3) EPC, EP Patent Application No. 16186330.3, dated Apr. 25, 2018, five pages.
Extended European Search Report for European Patent Application No. EP 16186330.3, dated Jan. 12, 2017, 7 Pages.
Korean Intellectual Property Office, Grant of Patent, KR Patent Application No. 10-2015-0184885, dated Jul. 4, 2019, three pages.
Office Action for Chinese Patent Application No. CN 201610770322. 3, dated Sep. 25, 2017, 21 Pages.
Office Action for U.S. Appl. No. 15/248,852, dated Aug. 28, 2017, 16 Pages.
Office Action for U.S. Appl. No. 15/248,852, dated Mar. 21, 2017, 13 Pages.
United States Office Action, U.S. Appl. No. 15/927,692, dated Aug. 1, 2018, seven pages.
European Patent Office, Extended European Search Report and Opinion, EP Patent Application No. 19191487.8, dated Nov. 26, 2019, eight pages.

\* cited by examiner

ORGANIC LIGHT-EMITTING DISPLAY DEVICE

CROSS-REFERENCE TO RELATED APPLICATIONS

This application is a continuation of U.S. patent application Ser. No. 16/281,787 filed on Feb. 21, 2019 which is a continuation of U.S. patent application Ser. No. 15/927,692 filed on Mar. 21, 2018 which is a continuation of U.S. patent application Ser. No. 15/248,852 filed on Aug. 26, 2016 which claims priority from Republic of Korea Patent Application No. 10-2015-0123243 filed on Aug. 31, 2015, and Republic of Korea Patent Application No. 10-2015-0184885 filed on Dec. 23, 2015, the disclosures of which are each incorporated herein by reference in its entirety.

BACKGROUND

Technical Field

The present disclosure relates to a flexible organic light-emitting display device having a structure showing minimal deformation against bending stress.

Description of the Related Art

As the era of information technology has truly begun, the field of display devices has rapidly advanced. In accordance with this, research is ongoing into various display devices which are thinner, lighter and consume less power. Such display devices include a liquid crystal display (LCD) device, a plasma display panel (PDP) device, a field emission display (FED) device, an electro-wetting display (EWD) device, quantum dot displays, and an organic light-emitting display (OLED) device, etc.

Among others, an organic light-emitting display (OLED) device is capable of producing light and thus does not require an additional light source, as in a liquid crystal display (LCD) device. Therefore, an organic light-emitting display device can be made lighter and thinner than an LCD device. Further, an organic light-emitting display device has advantages in that it is driven with low voltage to consume less power, and in that it has shorter response time, wider viewing angle and higher contrast ratio (CR). For these reasons, an organic light-emitting display device is currently under development as the next generation display device. Despite such advantages, organic light-emitting display devices are less reliable than other display devices since organic light-emitting materials are especially vulnerable to moisture and oxygen.

An organic light-emitting display device includes an organic light-emitting element including an anode, an organic emission layer and a cathode. The organic emission layer emits light by combining holes from the anode and electrons from the cathode. The organic emission layer is very vulnerable to moisture and oxygen and thus an encapsulation structure is required.

A flexible organic light-emitting display device has been regarded as the next generation display device. Such flexible organic light-emitting display device is fabricated by forming a display area and various conductive lines on a flexible substrate made of plastic or the like so that it can display images even if it is bent like paper.

Applications of such flexible organic light-emitting display devices become wider, including computer monitors and televisions as well as personal portable devices. Accordingly, research is on-going into flexible organic light-emitting display devices having a larger display area with reduced volume and weight.

SUMMARY

The inventor of the present disclosure has studied on flexible organic light-emitting display device capable of being rolled up (e.g. into a scroll-like form) and stored or retracted in such manner.

Such flexible organic light-emitting display devices may be kept in the form of a scroll for a long-term period (e.g., more than 100 hours) due to non-use, portability, or other reasons. When a flexible organic light-emitting display device is unrolled after being rolled up for such a long-term period, it may be deformed or other irregularities may occur.

The inventor of the present disclosure has analyzed the relationship among a various elements of the flexible organic light-emitting display device to find factors that contribute to such deformation.

An object of the present disclosure is to provide a flexible organic light-emitting display device capable of reducing the degree of deformation occurring when it is stored in a rolled-up form (e.g. like a scroll) for a long-term period.

Further, another object of the present disclosure is to provide a flexible organic light-emitting display device in which thickness of each substrate is optimized so that the flexible organic light-emitting display device can be rolled up (e.g. into a scroll) with minimal deformation.

Furthermore, the other object of the present disclosure is to provide a flexible organic light-emitting display device that has a resilience ability so that it is not deformed after being rolled up for a long-term period and has strength against impact (i.e., is not easily broken) by way of adjusting the Young's modulus of an encapsulation unit of the flexible organic light-emitting display device.

Moreover, the other object of the present disclosure is to provide a flexible organic light-emitting display device with improved reliability and durability of an encapsulation unit thereof.

It should be noted that objects of the present disclosure are not limited to the above-described objects, and other objects of the present disclosure will be apparent to those skilled in the art from the following descriptions.

According to an aspect of the present disclosure, there is provided an organic light-emitting display device. The organic light-emitting display device includes: a first flexible substrate; a second flexible substrate; a plurality of organic light-emitting pixels on the first flexible substrate and interposed between the first flexible substrate and the second flexible substrate; an encapsulation unit covering the plurality of organic light-emitting pixels; and an adhesive layer on the encapsulation unit, the adhesive layer adhering together the encapsulation unit and the second flexible substrate. The adhesive layer has a Young's modulus that is equal to or larger than a value so that the first flexible substrate is not deformed by bending stress if it is reverted from a rolled up form. The thickness of the adhesive layer is determined with respect to the thickness of the first flexible substrate, the curvature radius threshold of the first flexible substrate, and the Young's modulus value of the adhesive layer. The plurality of organic light-emitting pixels is configured to be adjacent to a neutral plane, and wherein the neutral plane of the flexible organic light-emitting display device passes through portions of the encapsulation unit covering plurality of organic light-emitting pixels.

According to another aspect of the present disclosure, there is provided an organic light-emitting display device. The organic light-emitting display device includes: a first flexible substrate; a second flexible substrate; a plurality of organic light-emitting pixels on the first flexible substrate and interposed between the first flexible substrate and the second flexible substrate; an encapsulation unit covering the plurality of organic light-emitting pixels; and an adhesive layer configured to adhere together the encapsulation unit and the second flexible substrate. The first flexible substrate maintains an elastic deformation property when the first flexible substrate is rolled to have a curvature radius equal to or larger than a threshold curvature radius for the first flexible substrate. The second flexible substrate maintains an elastic deformation property when the second flexible substrate is rolled to have a curvature radius equal to or larger than a threshold curvature radius for the second flexible substrate.

According to another aspect of the present disclosure, there is provided a flexible organic light-emitting display device comprising: a first flexible substrate; a plurality of organic light-emitting pixels on the first flexible substrate; an encapsulation unit covering the plurality of organic light-emitting pixels, a neutral plane of the flexible organic light-emitting display device passing through a portion of the encapsulation unit that overlaps the plurality of organic light-emitting pixels; an adhesive layer on the encapsulation unit; and a second flexible substrate on the adhesive unit, the adhesive unit adhered to the second flexible substrate and the encapsulation unit.

Particulars of the exemplary embodiments of the present disclosure will be described in the detail description with reference to the accompanying drawings.

According to an exemplary embodiment of the present disclosure, the degree of deformation of a flexible organic light-emitting display device when it is rolled into a scroll and kept in the form of the scroll can be reduced.

According to an exemplary embodiment of the present disclosure, the thickness of an encapsulation unit of a flexible organic light-emitting display device is reduced, thereby reducing the curvature radius threshold value that determines the limit of the diameter of the flexible organic light-emitting display device, in which can be rolled into.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure can be defined by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B", "an element A above an element B", "an element A below an element B" and "an element A adjacent to an element B" may allow another element C to be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

Various physical properties such as Young's modulus, stress, pressure, viscosity, adhesive force and strength are measured at a room temperature unless stated otherwise. The room temperature may refer to approximately 15° C. to 35° C., specifically approximately 20° C. to 25° C., and more specifically 25° C.

The adhesive force refers to that measured on glass (or the particular material to which the adhesive acts on) unless stated otherwise.

The terms first, second and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

The features of various embodiments of the present disclosure can be partially or entirely bonded to or combined with each other and can be interlocked and/or operated in technically various ways as can be fully understood by a person having ordinary skill in the art, and the embodiments can be carried out independently of or in association with each other.

Hereinafter, exemplary embodiments of the present disclosure will be described in detail with reference to the accompanying drawings.

Figure 1:
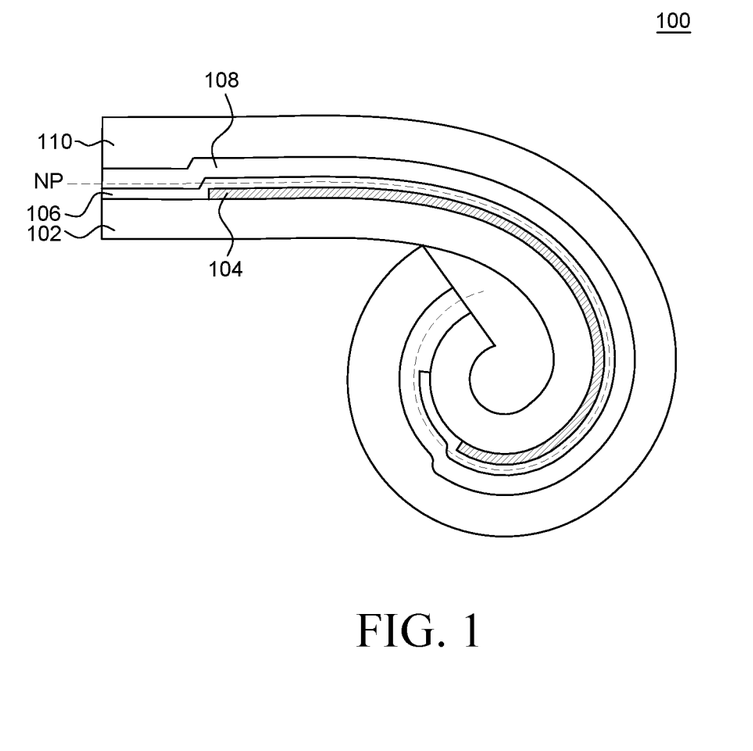
FIG. 1 is a schematic cross-sectional view of a flexible organic light-emitting display device according to an exemplary embodiment of the present disclosure.

FIG. 1 is a schematic cross-sectional view of a flexible organic light-emitting display device according to an exemplary embodiment of the present disclosure.

Referring to FIG. 1, the organic light-emitting display device 100 according to an exemplary embodiment of the present disclosure includes a first flexible substrate 102, a plurality of organic light-emitting pixels 104, an encapsulation unit 106, an adhesive layer 108 and a second flexible substrate 110.

The first flexible substrate 102 has flexible characteristics. A plurality of organic light-emitting pixels 104 is disposed on the first flexible substrate 102. Images are displayed by the plurality of organic light-emitting pixels 104. The encapsulation unit 106 is disposed on the plurality of organic light-emitting pixels 104 to protect the plurality of organic light-emitting pixels 104 from oxygen and moisture. The adhesive layer 108 attaches the encapsulation unit 106 of the first flexible substrate 102 to the second flexible substrate 110.

The flexible organic light-emitting display device 100 can be rolled into a scroll or otherwise configured into a more compact form. Here, the first flexible substrate 102 and the second flexible substrate 110 of the flexible organic light-emitting display device 100 can be made of different materials. The flexible organic light-emitting display device 100 can be rolled up such that the ends of the first and second flexible substrates 102, 110 are curved toward the first flexible substrate 102.

That is, the first flexible substrate 102 receives compressive stress when the organic light-emitting display device 100 is rolled up. Here, it can be said that the plurality of organic light-emitting pixels 104 is located on a neutral plane (NP). The encapsulation unit 106 has a certain minimum Young's modulus value so that it is not deformed by bending stress when it is kept in the form of a scroll or in some other compact form. The second flexible substrate 110 receives tensile stress when it is rolled up. The second flexible substrate 110 can be made of a material having a higher breaking strength versus tensile stress than that of the first flexible substrate 102.

Figure 2:
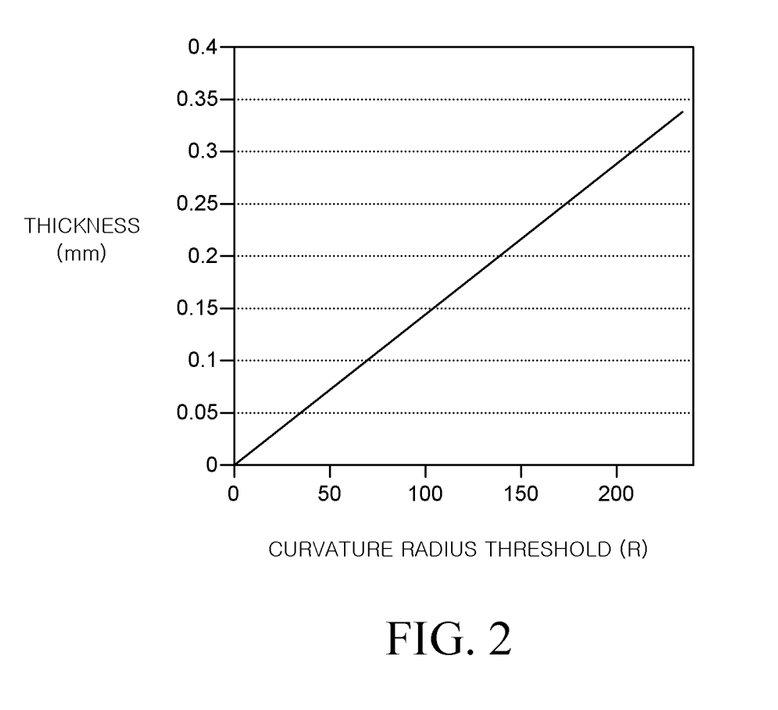
FIG. 2 is a graph illustrating thickness versus curvature radius threshold of the first flexible substrate of the flexible organic light-emitting display device according to an exemplary embodiment of the present disclosure.

FIG. 2 is a graph for illustrating thickness versus curvature radius threshold of the first flexible substrate 102 of the flexible organic light-emitting display device 100 according to an exemplary embodiment of the present disclosure.

Equation 1 shown below expresses thickness versus curvature radius threshold of the first flexible substrate of the flexible organic light-emitting display device according to the exemplary embodiment of the present disclosure.

Hereinafter, referring to FIGS. 1 and 2 and Equation 1, a way of determining the thickness of the first flexible substrate 102, so that the flexible organic light-emitting display device 100 according to the exemplary embodiment of the present disclosure can be rolled up, is described.

The first flexible substrate 102 has flexible characteristics. The first flexible substrate 102 may be made of, for example, an organic material or an inorganic material and may be optically-transparent, flexible and chemically resistant so that it is applicable to a deposition process at a high temperature. The first flexible substrate 102 may be, for example, a glass substrate that has excellent water vapor transmission rate (WVTR), is flexible and has transparency at the visible wavelengths (i.e. has see-through (e.g., transparent) characteristics). In order to achieve such characteristics, the thickness of the glass as the first flexible substrate 102 has to be thin. However, since the glass is easily broken or damaged, various factors have to be considered in determining the thickness of the glass substrate, to enable it to be rolled into a scroll with sufficient strength.

For example, the radius of a circular shape when the flexible organic light-emitting display device 100 is rolled up into a scroll or cylinder as small as possible may be determined as 100 mm. Then, the curvature radius (i.e., the curvature radius, 1 R is equivalent to 1 mm) of the first flexible substrate 102 is 100R.

In another example, the radius of the circle (i.e., the radius of circular shape) may be 50 mm. Then, the curvature radius of the first flexible substrate 102 is 50R.

It should be noted that the above-described examples with respect to the radius are merely illustrative and the present disclosure is not limited thereto.

The thickness of the first flexible substrate 102 may be determined based on a first bending stress threshold $\sigma_{TH}$ and a Young's modulus E. The first bending stress threshold $\sigma_{TH}$ and the Young's modulus E may be constant values of the material of the first flexible substrate 102.

For example, if the first flexible substrate 102 is made of glass, the first bending stress threshold σTH of the first flexible substrate 102 may be 50 MPa. Here, bending stress threshold of a component refers to a maximum possible bending stress before damaging the component, e.g. the first flexible substrate. In addition, the Young's modulus may be 71.5 GPa. If the curvature radius threshold $R_{TH}$ of the first flexible substrate 102 is 100R, the maximum thickness of the first flexible substrate 102 may be determined using Equation 1 below:

$$\sigma_{TH} = \frac{(E \times T/2)}{R_{TH}} \qquad \text{[Equation 1]}$$

where $\sigma_{TH}$ denotes to the first bending stress threshold, E denotes the Young's modulus, T denotes the thickness of the first flexible substrate 102, and $R_{TH}$ denotes the curvature radius threshold. Here, curvature radius threshold of a component refers to a maximum possible curvature radius before damaging the component, e.g. the first flexible substrate.

For example, in Equation 1, if the curvature radius threshold $R_{TH}$ of the flexible organic light-emitting display device 100 is determined as 100R, the first bending stress threshold $\sigma_{TH}$ may be 50 MPa and the Young's modulus may be 71.5 GPa. Accordingly, the thickness T of the first flexible substrate 102 is equal to approximately 0.14 mm or less.

For example, in Equation 1, if the curvature radius threshold $R_{TH}$ of the flexible organic light-emitting display device 100 is determined as 50R, the first bending stress threshold $\sigma_{TH}$ may be 50 MPa and the Young's modulus may be 71.5 GPa. Accordingly, the thickness T of the first flexible substrate 102 is equal to approximately 70 μm or less.

It can be seen that the thickness of the first flexible substrate 102 is in proportion to the curvature radius threshold ($R_{TH}$) of the flexible organic light-emitting display device 100.

For example, the first flexible substrate 102 may be a substrate that is etched (or otherwise applied with certain surface treatment) to achieve a desired curvature radius threshold ($R_{TH}$). Specifically, during the process of forming the plurality of organic light-emitting pixels 104 on the first flexible substrate 102, the thickness of the substrate has to be at least 1 mm in order to maintain flatness. However, the thickness of the first flexible substrate 102 has to be reduced after forming the plurality of organic light-emitting pixels 104 in order to decrease the curvature radius threshold ($R_{TH}$). Accordingly, there is an advantage in processing or manufacturing in that the first flexible substrate 102 may be etched after forming the plurality of organic light-emitting pixels 104. However, the thickness of the first flexible substrate 102 is subject to the target curvature radius. Consequently, the thickness of the first flexible substrate 102 is merely illustrative and the present disclosure is not limited thereto.

For example, the thickness of the first flexible substrate 102 may be selected from 30 μm to 100 μm in consideration of the curvature radius threshold ($R_{TH}$).

For example, the first flexible substrate 102 may be made of a material having a higher breaking strength with respect to the compressive stress than that of the second flexible substrate 110.

That is, the first flexible substrate 102 before etching may have a first thickness during the process of forming the plurality of organic light-emitting pixels 104, and after forming the plurality of organic light-emitting pixels 104, may have a second thickness which is thinner than the first thickness. The plurality of organic light-emitting pixels 104 is disposed on the first flexible substrate 102 that has the thickness T determined based on a certain curvature radius threshold ($R_{TH}$). The plurality of organic light-emitting pixels 104 includes at least an organic light-emitting diode (OLED) and a driving circuitry. The organic light-emitting diode includes at least an anode, an organic emission layer and a cathode. A bank may be disposed between the organic light-emitting pixels (and/or sub-pixels) to separate them from one another. The anode may be patterned so that it is disposed in each of the organic light-emitting pixels and may be covered by the bank. The organic light-emitting diode may include a variety of layers such as an electron transport layer (ELT), an emission layer (EML) and a hole transport layer (HTL). Such layers may be independent or combined in their functionalities. A capping layer may be further disposed on the cathode. The driving circuitry includes a switching transistor, a driving transistor and a capacitor. Each of the transistors may include a gate electrode extended from a gate line, a source electrode and a drain electrode extended from a data line, and may adjust the amount of current flowing in the driving transistor in proportion to data voltage applied to the driving transistor. The driving transistor may be connected to the anode of the organic light-emitting diode to supply current thereto.

The thickness of each of the plurality of organic light-emitting pixels 104 may be, for example, 1 μm to 10 μm. The thickness may be the sum of the thickness of lines of the driving circuitry, the thickness of a passivation layer, a planarization layer insulating the lines from one another, the height of the organic light-emitting diode and the height of the bank.

The neutral plane NP of the flexible organic light-emitting display device 100 is configured to be adjacent to the plane where the plurality of organic light-emitting pixels 104 is formed. Herein, the neutral plane NP may be defined as follows: when the flexible organic light-emitting display device 100 is bent, tensile stress is created on one side (e.g., a first side) of the neutral plane while compressive stress is created on the other side (e.g., a second side) of the neutral plane. Accordingly, there is a plane that is not under tensile stress and compressive stress, which is referred to as the neutral plane (NP). Thus, in theory, there is no bending stress at the neutral plane (NP).

By configuring the neutral plane NP at the location where the plurality of organic light-emitting pixels 104 is disposed, no stress is applied to the plurality of organic light-emitting pixels 104 when the flexible organic light-emitting display device 100 is bent. As a result, damage to the plurality of organic light-emitting pixels 104 can be reduced. However, this is merely illustrative and the present disclosure is not limited thereto. The neutral plane NP may be formed on the interface between the plurality of organic light-emitting pixels 104 and the adhesive layer 108. In that case, no stress is applied to the interface between the plurality of organic light-emitting pixels 104 and the adhesive layer 108, and thus no delamination takes place on the interface. More specifically, the neutral plane NP may be positioned in an area which is ±15 μm away from the plurality of organic light-emitting pixels 104. However, this is merely illustrative and the present disclosure is not limited thereto. If the neutral plane NP is too far from the organic light-emitting pixels 104, stress is exerted on the organic light-emitting pixels 104. Accordingly, the neutral plane NP has to be configured near the organic light-emitting pixels 104.

The encapsulation unit 106 may be made of an inorganic material. For example, the encapsulation unit 106 may be made of silicon nitride ($SiN_x$), silicon oxide ($SiO_x$), aluminum oxide ($Al_2O_3$), etc. Namely, a material having good WVTR may be chosen.

The encapsulation unit 106 is disposed adjacent to the neutral plane NP. According to the above-described configuration, the bending stress exerted on the encapsulation unit 106 can be reduced, and thus the possibility that cracks or damages occurred in the inorganic layer of the encapsulation unit 106 may be drastically lowered. Accordingly, the durability of the flexible organic light-emitting display device 100 against bending can be enhanced.

The encapsulation unit 106 may be made up of a single inorganic film. However, this is merely illustrative and the present disclosure is not limited thereto. The encapsulation unit 106 may be formed by forming a first inorganic film, disposing an overcoat layer on the first inorganic film to compensate for irregularity caused by foreign matters, forming a second inorganic film on the overcoat layer, and sealing the overcoat layer by the first and second inorganic film. In this manner, the encapsulation unit 106 can compensate for irregularity caused by foreign matters.

The adhesive layer 108 is disposed on the encapsulation unit 106. The adhesive layer 108 secures the first flexible substrate 102 to the second flexible substrate 110.

The adhesive layer 108 is configured with a certain thickness to achieve sufficient resilience so that it can be unrolled after being stored in the form of a scroll having a certain curvature radius for a long-term period, as well as sufficient strength so that it is not broken by external impact.

Firstly, the adhesive layer 108 has a certain adhesive force. The adhesive force of the adhesive layer 108 can be increased by a curing process. After the curing, the adhesive force of the adhesive layer 108 may be equal to 450 gf/10 mm or higher. If the adhesive force is too weak, the first flexible substrate 102 may be delaminated from the second flexible substrate 110. Accordingly, the adhesive layer 108 has a sufficient adhesive force so that no delamination takes place when it is rolled into a scroll.

Secondly, the adhesive layer 108 has a certain Young's modulus E. In addition, the Young's modulus of the adhesive layer 108 is smaller than that of the first flexible substrate 102. If the Young's modulus of the adhesive layer 108 is smaller than that of the first flexible substrate 102, there is an advantage in that the adhesive layer 108 can absorb the stress exerted on the first flexible substrate 102.

For example, the Young's modulus E of the adhesive layer 108 after curing may be 900 MPa or higher. For example, if the Young's modulus E is too low, there is a problem in that the flexible organic light-emitting display device may be easily deformed. That is, if the Young's modulus E is too low, the flexible organic light-emitting display device may be easily deformed, and when it is stored in the form of a scroll for a long-term period, the adhesive layer 108 may absorb the bending stress such that the organic light-emitting display device may remain bent. In particular, such a problem may be critical for a flexible organic light-emitting display device that can be rolled into a scroll.

For example, if the Young's modulus E of the adhesive layer after curing is low (e.g., 800 MPa) the adhesive layer 108 may absorb the stress well, and thus this may be regarded as an advantage in terms of bending characteristic. However, when the flexible organic light-emitting display device is kept in the form of a scroll for a long-term period, the shape of the adhesive layer 108 may be deformed due to the stress exerted for the long time. Therefore, the adhesive layer having a Young's modulus of 800 MPa or less may not be applied to the flexible organic light-emitting display device that is rolled into a scroll.

Thirdly, the adhesive layer 108 has a certain thickness. For example, if the first flexible substrate 102 is made of glass, it may be easily broken by external impact. Specifically, if the first flexible substrate 102 is an etched glass, it is more vulnerable to external impact. In addition, if cracks take place in the first flexible substrate 102 or the first flexible substrate 102 is damaged, moisture and oxygen may permeate into the organic light-emitting pixels 104, resulting in defects.

However, if the first flexible substrate 102 is made of glass, it may have a flaw, a scratch, or a surface damage made during a manufacturing process. When the glass substrate is bent, the tensile stress is concentrated on such a surface flaw, a scratch or a surface damage. Accordingly, the substrate may be broken where a surface flaw, a scratch or a surface damage exists. However, by an etching process, there is an advantage in that such surface flaws, scratches or surface damages can be etched too. Accordingly, there is an advantage in that reliability against the tensile stress can be increased even if the thickness of the first flexible substrate 102 is substantially reduced.

Figure 3:
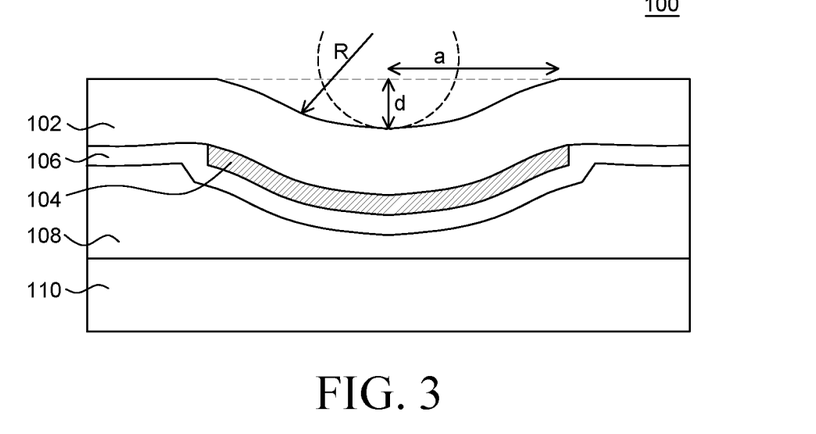
FIG. 3 is a diagram for illustrating how to mitigate stress in terms of the thickness of the first flexible substrate and the thickness of the adhesive layer of the flexible organic light-emitting display device according to an exemplary embodiment of the present disclosure.

FIG. 3 is a diagram for illustrating how to mitigate stress in terms of the thickness of the first flexible substrate 102 and the thickness of the adhesive layer 108 of the flexible organic light-emitting display device 100 according to an exemplary embodiment of the present disclosure.

Equation 2 expresses stress according to the thickness of the first flexible substrate 102 and the thickness of the adhesive layer 108 of the flexible organic light-emitting display device 100 according to an exemplary embodiment of the present disclosure.

Hereinafter, a way of determining the thickness of the adhesive layer 108 of the flexible organic light-emitting display device 100 according to an exemplary embodiment of the present disclosure will be described with reference to FIG. 3 and Equation 2.

The adhesive layer 108 is configured to increase strength of the first flexible substrate 102 against external impact. For example, the strength may be measured by a ball drop test. The ball drop test is carried out by dropping an iron ball having a certain diameter from a predetermined height onto the flexible organic light-emitting display device 100, and measuring damage to the flexible organic light-emitting display device 100. This is related with the curvature radius threshold ($R_{TH}$) of the first flexible substrate 102. That is, as the first flexible substrate 102 becomes thinner in order to decrease the curvature radius threshold ($R_{TH}$), the strength of the flexible organic light-emitting display device 100 may be weakened.

$$U_T \propto \frac{d^2}{a^4} E_g h_g^3 + \frac{d^5}{a} \frac{E_p}{h_p^3} \qquad \text{[Equation 2]}$$

Referring to Equation 2, $U_T$ denotes the total energy value generated when the iron ball having the predetermined diameter freefalls to collide with the flexible organic light-emitting display device 100, $E_g$ denotes the Young's modulus E of the first flexible substrate 102, $h_g$ denotes the thickness of the first flexible substrate 102, $E_p$ denotes the Young's modulus E of the adhesive layer 108, $h_p$ denotes the thickness of the adhesive layer 108. In FIG. 3 and Equation 2, α denotes the radius of the deformed area of the first flexible substrate 102. In FIG. 3 and Equation 2, d denotes the depth of the recessed part of the organic light-emitting display device 100 toward the adhesive layer 108 as the iron ball freefalls onto it. According to Equation 2, the total energy $U_T$ is dispersed as the first flexible substrate 102 and the adhesive layer 108 are deformed. The first flexible substrate 102 is broken if the $U_T$ value exceeds the threshold value that the first flexible substrate 102 can tolerate.

It can be seen from Equation 2 that the damage to the first flexible substrate 102 can be avoided by decreasing the Young's modulus E of the adhesive layer 108 or by increasing the thickness $h_p$ of the adhesive layer 108. However, as described earlier, if the Young's modulus $E_p$ of the adhesive layer 108 is low, it may be deformed when the flexible organic light-emitting display device 100 is stored in the form of the a scroll for a long-term period. Accordingly, the Young's modulus $E_p$ of the adhesive layer 108 should be larger than a certain value. For example, the Young's modulus of the adhesive layer 108 may be configured to be at least 900 MPa in consideration of reducing the degree of deformation.

The thickness of the adhesive layer 108 should be increased with respect to the Young's modulus $E_p$. For example, the thickness of the adhesive layer 108 may be configured to be at least 40 μm. However, if the thickness of the adhesive layer 108 becomes larger than a certain value, the thickness of the flexible organic light-emitting display device 100 is also increased. Accordingly, the thickness may be configured to be equal to or less than 60 μm.

Referring back to FIG. 1, the second flexible substrate 110 has flexible characteristics. The second flexible substrate 110 is made of a material having a higher breaking strength than that of the first flexible substrate 102. For example, the second flexible substrate 110 may be a metal plate. The second flexible substrate 110 may be a metal plate or a foil made of copper or aluminum.

In particular, if the flexible organic light-emitting display device 100 is configured to be rolled toward the first flexible substrate 102, the second flexible substrate 110 receives tensile stress all the time.

If the first flexible substrate 102 and the second flexible substrate 110 are made of the same glass, the first flexible substrate 102 receives compressive stress while the second flexible substrate 110 receives tensile stress. However, glass may not be easily broken by compressive stress but it can be easily broken by tensile stress. Accordingly, if the second flexible substrate 110 is made of glass and is rolled into a scroll, the second flexible substrate 110 may be broken.

If the second flexible substrate 110 is a metal plate made of copper or aluminum, there is an advantage in that it is not easily broken by the tensile stress. Accordingly, the flexible organic light-emitting display device 100 according to an exemplary embodiment of the present disclosure is rolled toward the first flexible substrate 102, the first flexible substrate 102 and the second flexible substrate 110 are not easily broken by the tensile stress.

For example, the thickness of the second flexible substrate 110 may be determined between 10 μm and 120 μm.

Figure 4:
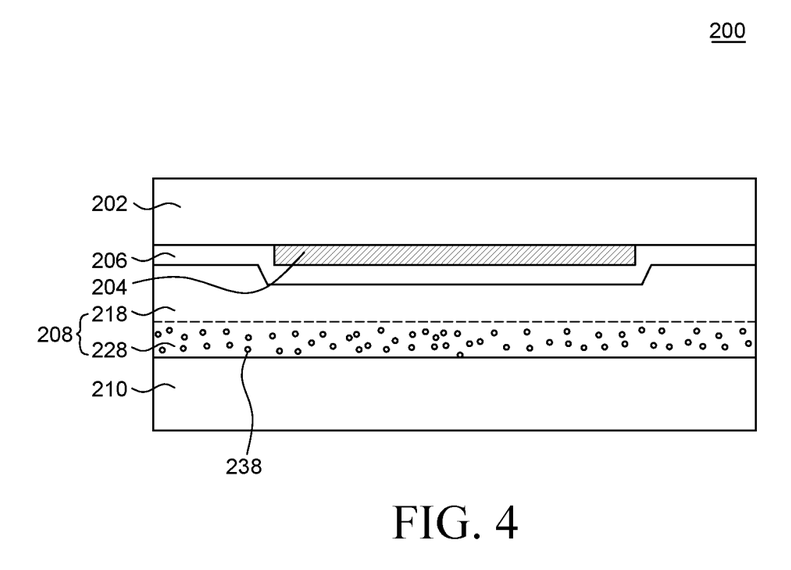
FIG. 4 is a schematic cross-sectional view of a flexible organic light-emitting display device according to another exemplary embodiment of the present disclosure.

FIG. 4 is a schematic cross-sectional view of a flexible organic light-emitting display device 200 according to another exemplary embodiment of the present disclosure.

In the following description, for convenience of description, a flexible organic light-emitting display device 200 according to another exemplary embodiment of the present disclosure will be described focusing on differences from the flexible organic light-emitting display device 100 according to the exemplary embodiment of the present disclosure, and the redundant features will be omitted.

Referring to FIG. 4, an adhesive layer 208 of the flexible organic light-emitting display device 200 includes at least two layers. A first adhesive layer 218 of the adhesive layer 208 is disposed closer to a first flexible substrate 202. A second adhesive layer 228 is disposed closer to a second flexible substrate 210. The second adhesive layer 228 contains moisture absorbents 238 (i.e., getters). The thickness of the adhesive layer 208 according to the exemplary embodiments of the present disclosure may be larger than the related art adhesive layers with respect to the bending characteristics and strength of the first flexible substrate. In addition, the adhesive layer 208 cannot sufficiently block moisture permeation, compared to the second flexible substrate 210. Accordingly, moisture may permeate through the side surfaces of the adhesive layer 208. In particular, the thicker the adhesive layer 208 is, the more likely moisture permeates through the side surfaces. For this reason, the second adhesive layer 228 contains the moisture absorbents 238. The moisture absorbents 238 may damage an encapsulation unit 206. Therefore, the first adhesive layer 218 is interposed between the moisture absorbents 238 and the encapsulation unit 206 to protect the encapsulation unit 206 from the moisture absorbents 238. Further, a plurality of organic light-emitting pixels 204 is disposed on the first flexible substrate 202.

For example, the first adhesive layer 218 may have a thickness between 5 μm and 8 μm so as to protect the encapsulation unit 206 from the moisture absorbents 238 of the second adhesive layer 228. In order to enhance the strength of the first flexible substrate 202 and suppress moisture from permeating through the side surfaces, the sum of the thickness of the first adhesive layer 218 and the thickness of the second adhesive layer 228 may be at least 40 μm to 60 μm. However, this is merely illustrative and the present disclosure is not limited thereto.

In some embodiments of the present disclosure, a flexible organic light-emitting display device may be disposed in a structure capable of scrolling the flexible organic light-emitting display device.

In some embodiments of the present disclosure, one side of the flexible organic light-emitting display device is fixed to a cylinder having a diameter such that it may be rolled or unrolled according to the rotation of the cylinder. However, the inventive concepts herein are not limited to display devices or screens that are fixed or operatively attached to a cylinder, as other types of support structures that allow different form factors (i.e. opening for usage and closing for stowage, etc.) are possible.

The exemplary embodiments of the present disclosure may be summarized as follows:

A flexible organic light-emitting display device according to exemplary embodiments of the present disclosure includes a first flexible substrate on which a plurality of organic light-emitting pixels is disposed; a second flexible substrate facing the plurality of organic light-emitting pixels on the first flexible substrate; and an adhesive layer configured to adhere the first flexible substrate to the second flexible substrate. A neutral plane is configured adjacent to the plurality of organic light-emitting pixels such that the stress by bending is not created when the flexible organic light-emitting display device is rolled toward the first flexible substrate, thereby protecting the organic light-emitting pixels from the stress.

The first flexible substrate of the flexible organic light-emitting display device according to the exemplary embodiments of the present disclosure is made of a material having a high Young's modulus so that the first flexible substrate can be unrolled flatly. For example, the first flexible substrate is made of an etched glass. According to the above-described configuration, there is an advantage in that the flatness of the substrate is maintained during a manufacturing process of the organic light-emitting pixels, so that desired yield and processing conditions can be achieved. In addition, there is an advantage in that a desired curvature radius threshold of the flexible organic light-emitting display device can be achieved since the substrate is etched to a certain thickness after forming the organic light-emitting pixels.

The adhesive layer of the flexible organic light-emitting display device according to the exemplary embodiments of the present disclosure is made of a material having a Young's modulus larger than a certain value so that it is not deformed when it is rolled into a scroll. In addition, in order to mitigate the compressive stress on the first flexible substrate, the adhesive layer has a Young's modulus smaller than that of the first flexible substrate. That is, the Young's modulus of the adhesive layer is smaller than that of the first flexible substrate and is larger than a certain value so that the flexible organic light-emitting display device is not deformed when it is kept in the form of a scroll for long hours.

The thickness of the adhesive layer of the flexible organic light-emitting display device according to the exemplary embodiments of the present disclosure is determined with respect to the thickness of the first flexible substrate and the strength of the flexible organic light-emitting display device. That is, the adhesive layer has a thickness larger than a certain value in order to achieve a desired strength of the flexible organic light-emitting display device. In addition, the adhesive layer has a thickness smaller than a certain value with respect to the curvature radius threshold of the flexible organic light-emitting display device. That is, the thickness of the adhesive layer is determined in a range that obtains a desired strength at a given thickness of the first flexible substrate without increasing the curvature radius threshold of the flexible organic light-emitting display device.

The second flexible substrate of the flexible organic light-emitting display device according to the exemplary embodiments of the present disclosure is made of a material having a high Young's modulus value so that the first flexible substrate can be unrolled flatly. Since the second flexible substrate receives tensile stress when it is rolled, the second flexible substrate is made of a material having better durability against tensile stress than that of the first flexible substrate. For example, the second flexible substrate is made of a metal material. According to the above-described configuration, it is possible to avoid damage by the tensile stress when the flexible organic light-emitting display device is rolled into a scroll.

In some embodiments of the present disclosure, the flexible organic light-emitting display device may be rolled into a circle having a curvature radius larger than the minimum curvature radius that maintains elastic deformation property.

Specifically, the first flexible substrate is rolled into a circle having a curvature radius larger than the minimum curvature radius that maintains an elastic deformation property. In addition, the second flexible substrate is rolled into a circle having a curvature radius larger than the minimum curvature radius that maintains the elastic deformation property. The term "elastic deformation" refers to a property that allows a layer to restore its original shape as soon as stress is removed even after it is rolled for long hours.

In addition, the adhesive layer between the first and second flexible substrates has an inelastic (anelastic) deformation property. The term "inelastic deformation" refers to a property that a layer does not restore its original shape even after stress is removed or restores its original shape if it is rolled and stored for a certain period.

The Young's modulus of each of the first and second flexible substrates may be larger than that of the adhesive layer. For example, the first flexible substrate and/or the second flexible substrate may be made of one of glass, metal and ceramic. The adhesive layer may be made of a polymer.

According to the above-described configuration, even when the flexible organic light-emitting display device is stored in the form of a scroll for a long-term period, the elastic deformation property can be maintained as the first and second flexible substrates are rolled into a circle having a curvature radius larger than the minimum curvature radius that maintains the elastic deformation property. On the other hand, the adhesive layer has an inelastic deformation property, and thus it may be deformed after it is rolled for a long-term period. However, since the Young's modulus of each of the first and second flexible substrates is larger than that of the adhesive layer, the adhesive layer can restore its flat shape by virtue of the first and second flexible substrates.

In some embodiments of the present disclosure, the flexible organic light-emitting display device may maintain the elastic deformation property while having a brittle property and a plastic deformation property.

Specifically, the first flexible substrate has the elastic deformation property in general and such property may be changed into a brittle property if a stress above a certain level is exerted thereon. The second flexible substrate has the elastic deformation property in general and such property may be changed into a plastic deformation property if a stress above a certain level is exerted thereon. The term "brittle property" refers to a property that if a layer is deformed by stress, the layer is rarely plastically deformed but is shattered (e.g., breaks). The term "plastic deformation" refers to a property that has the elastic deformation property in general and such property may be changed into the inelastic deformation property if a stress above a certain level is exerted thereon.

The first flexible substrate may be rolled such that it receives a stress below a value that causes brittle property. Further, the second flexible substrate may be rolled such that it receives a stress below a value that causes plastic deformation.

For example, the first flexible substrate is made of glass. In addition, the second flexible substrate may be made of metal.

According to the above-described configuration, even if the flexible organic light-emitting display device is stored in the form of a scroll for a long-term period, the elastic deformation property can be maintained as the first and second flexible substrates are rolled into a circle having a curvature radius larger than the minimum curvature radius that can maintain the elastic deformation property.

In particular, if the first flexible substrate has brittle property, it has good resilience, and thus there is an advantage in that the flexible organic light-emitting display device is not deformed even after it is rolled for a long-term period.

In some embodiments of the present disclosure, the adhesive layer may be made of an elastomer. The term "elastomer" refers to a polymer with elastic deformation property, such as rubber (e.g., a very large deformation that can be restored at a low stress level). For example, the Young's modulus $E_p$ of the adhesive layer made of an elastomer may be 5 MPa to 100 MPa. That is, elastomer can be easily deformed even with a small stress, and has excellent resilience. Accordingly, if the adhesive layer is made of elastomer, it has very low Young's modulus, and thus there is an advantage in that it does not affect the deformation of the flexible organic light-emitting display device.

In some embodiments of the present disclosure, at least a surface of the first flexible substrate may be etched. For example, a first surface of the first flexible substrate may be etched, thereby removing a defect, a scratch or damage on the first surface. In particular, the etched surface may be configured to endure tensile stress. According to the above-described configuration, there is an advantage in that the reliability of the flexible organic light-emitting display device can be improved even if at least one surface of the first flexible substrate is etched.

In some embodiments of the present disclosure, both surfaces of the first flexible substrate may be etched. For example, a first surface and a second surface of the first flexible substrate may be etched, thereby removing a defect, a scratch or damage on the first and second surfaces may be removed. According to the above-described configuration, there is an advantage in that the reliability of the flexible organic light-emitting display device can be improved by etching both surfaces of the first flexible substrate.

The exemplary embodiments of the present disclosure can also be described as follows:

According to an aspect of the present disclosure, there is provided an organic light-emitting display device. The organic light-emitting display device includes: a first flexible substrate; a second flexible substrate facing the first flexible substrate; a plurality of organic light-emitting pixels on the first flexible substrate and interposed between the first flexible substrate and the second flexible substrate; an encapsulation unit between the first flexible substrate and the second flexible substrate to protect the plurality of organic light-emitting pixels from oxygen and moisture; and an adhesive layer on the encapsulation unit to adhere the first flexible substrate and the second flexible substrate. The plurality of organic light-emitting pixels is configured to be adjacent to a neutral plane. The adhesive layer has a Young's modulus that is equal to or larger than a certain value so that the first flexible substrate is not deformed by bending stress if it is retracted in a rolled up form for a certain period of time. The thickness of the adhesive layer is determined with respect to the thickness of the first flexible substrate, the curvature radius threshold of the first flexible substrate and the Young's modulus of the adhesive layer.

The first flexible substrate may be configured to receive compressive stress and the second flexible substrate may be configured to receive tensile stress, such that compressive stress is applied to the first flexible substrate and tensile stress is applied to the second flexible substrate when the first substrate is rolled up.

The second flexible substrate may be made of a material having a higher breaking strength against tensile stress than that of the first flexible substrate.

The second flexible substrate may be a metal plate having a thickness between 10 µm and 120 µm.

The first flexible substrate may be made of a material having a higher breaking strength against compressive stress than that of the second flexible substrate.

The first flexible substrate may be an etched glass substrate having a thickness between 30 µm and 100 µm.

The thickness of the adhesive layer may be between 40 µm and 60 µm.

The adhesive layer may further include a first adhesive layer adjacent to the plurality of organic light-emitting pixels, and a second adhesive layer adjacent to the second flexible substrate and containing a moisture absorbent.

The thickness of the first adhesive layer may be equal to at least 5 µm, and the thickness of the second adhesive layer may be equal to the thickness of the adhesive layer minus the thickness of the first adhesive layer.

The adhesive layer may be made of an epoxy resin having the Young's modulus of 900 MPa or higher under cured status, and the plurality of organic light-emitting pixels is configured to be adjacent to a neutral plane.

The first flexible substrate may be capable of being rolled up to have a curvature radius equal to or larger than a minimum curvature radius that maintains an elastic deformation property, the second flexible substrate may be rolled into a circle having a curvature radius equal to or larger than a minimum curvature radius that maintains the elastic deformation property, the adhesive layer may have inelastic deformation property, and the Young's modulus of each of the first flexible substrate and the second flexible substrate may be larger than that of the adhesive layer.

The first flexible substrate may have a brittle property while having the elastic deformation property, the first flexible substrate may be capable of being rolled up so that it receives a stress below a value that causes the brittle property, the second flexible substrate may have a plastic deformation property while having the elastic deformation property, the second flexible substrate may be capable of being rolled up so that it receives a stress below a value that causes the plastic deformation property.

The adhesive layer may be made of an elastomer and may have the Young's modulus between 5 MPa and 100 MPa.

A surface of the first flexible substrate may be etched, and the etched surface may be configured to receive tensile stress.

According to another aspect of the present disclosure, there is provided an organic light-emitting display device. The organic light-emitting display device includes: a first flexible substrate; a second flexible substrate facing the first flexible substrate; a plurality of organic light-emitting pixels on the first flexible substrate and between the first flexible substrate and the second flexible substrate; an encapsulation unit between the first flexible substrate and the second flexible substrate to protect the plurality of organic light-emitting pixels from oxygen and moisture; and an adhesive layer on the encapsulation unit to adhere the first flexible substrate and the second flexible substrate together.

The first flexible substrate may be capable of being rolled up to have a curvature radius equal to or larger than a minimum curvature radius that maintains an elastic deformation property, the second flexible substrate may be capable of being rolled up to have a curvature radius equal to or larger than a minimum curvature radius that maintains an elastic deformation property, the adhesive layer may have an elastic deformation property, and each of the first and second flexible substrates may have a Young's modulus that is larger than that of the adhesive layer.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. The scope of protection sought by the present disclosure is defined by the appended claims and all equivalents thereof are construed to be within the true scope of the present disclosure.

What is claimed is:

1. A flexible light-emitting display device comprising:
a first flexible substrate;
a plurality of light-emitting pixels on the first flexible substrate;
an encapsulation layer covering the plurality of light-emitting pixels;
an adhesive layer on the encapsulation layer;
a second flexible substrate on the adhesive layer, the adhesive layer adhered to the second flexible substrate and the encapsulation layer,
wherein each of the first flexible substrate and the second flexible substrate has a Young's modulus that is larger than a Young's modulus of the adhesive layer, and
wherein a neutral plane of the flexible light-emitting display device is positioned in an area which is ±15 µm away from the plurality of light-emitting pixels.

2. The flexible light-emitting display device of claim 1, wherein the first flexible substrate maintains an elastic deformation property when the first flexible substrate is bent to have a curvature radius equal to or larger than a threshold curvature radius for the first flexible substrate, and
wherein the second flexible substrate maintains an elastic deformation property when the second flexible substrate is bent to have a curvature radius equal to or larger than a threshold curvature radius for the second flexible substrate.

3. The flexible light-emitting display device of claim 1, wherein the adhesive layer has an elastic deformation property.

4. The flexible light-emitting display device of claim 1, wherein the first flexible substrate and the second flexible substrate have an elastic deformation property in general, when a stress above a certain level is exerted on the first flexible substrate, the elastic deformation property is changed into a brittle property, and when a stress above a certain level is exerted on the second flexible substrate, the elastic deformation property is changed into a plastic deformation property.

5. The flexible light-emitting display device of claim 1, wherein the Young's modulus of the adhesive layer is at least 900 MP.

6. The flexible light-emitting display device of claim 1, wherein the adhesive layer is made of an elastomer and has the Young's modulus between 5 MPa and 100 MPa.

7. The flexible light-emitting display device of claim 1, wherein the first flexible substrate comprises organic material.

8. The flexible light-emitting display device of claim 1, wherein a thickness of the adhesive layer is between 40 μm and 60 μm.

9. The flexible light-emitting display device of claim 7, wherein the organic material comprises plastic.

10. A flexible light-emitting display device comprising:
a first flexible substrate;
a plurality of light emitting pixels on the first flexible substrate;
an encapsulation layer covering the plurality of light emitting pixels;
an adhesive layer on the encapsulation layer; and
a second flexible substrate on the adhesive layer, the adhesive layer adhered to the second flexible substrate and the encapsulation layer;
wherein each of the first flexible substrate and the second flexible substrate has a Young's modulus that is larger than a Young's modulus of the adhesive layer,
wherein a thickness of the adhesive layer is between 40 μm and 60 μm and
wherein a thickness of the second substrate is between 10 μm and 120 μm.

11. The flexible light-emitting display device of claim 10, wherein the first flexible substrate maintains an elastic deformation property when the first flexible substrate is bent to have a curvature radius equal to or larger than a threshold curvature radius for the first flexible substrate, wherein the second flexible substrate maintains an elastic deformation property when the second flexible substrate is bent to have a curvature radius equal to or larger than a threshold curvature radius for the second flexible substrate.

12. The flexible light-emitting display device of claim 10, wherein the adhesive layer has an elastic deformation property.

13. The flexible light-emitting display device of claim 10, wherein the first flexible substrate and the second flexible substrate have an elastic deformation property in general, when a stress above a certain level is exerted on the first flexible substrate, the elastic deformation property is changed into a brittle property, and when a stress above a certain level is exerted on the second flexible substrate, the elastic deformation property is changed into a plastic deformation property.

14. The flexible light-emitting display device of claim 10, wherein a neutral plane of the flexible light-emitting display device is positioned in an area which is ±15 μm away from the plurality of light-emitting pixels.

15. The flexible light-emitting display device of claim 10, wherein a neutral plane of the flexible light-emitting display device is positioned between the plurality of light-emitting pixels and the adhesive layer.

16. The flexible light-emitting display device of claim 10, wherein the adhesive layer has an elastic deformation property or an inelastic (anelastic) deformation property.

17. The flexible light-emitting display device of claim 10, wherein the first flexible substrate comprises organic material.

18. The flexible light-emitting display device of claim 10, wherein a thickness of the first flexible substrate is based on a first bending stress threshold and the Young's modulus of the first flexible substrate.

19. The flexible light-emitting display device of claim 10, wherein the adhesive layer is an epoxy resin having a Young's modulus of 900 MPa or higher after the epoxy resin is cured.

20. The flexible light-emitting display device of claim 17, wherein the organic material comprises plastic.

* * * * *